United States Patent [19]

Okajima et al.

[11] Patent Number: 5,446,381
[45] Date of Patent: Aug. 29, 1995

[54] OPTICAL VOLTAGE ELECTRIC FIELD SENSOR

[75] Inventors: Hisakazu Okajima, Nishikasugai; Masanobu Yamamoto, Handa, both of Japan

[73] Assignee: NGK Insulators, Ltd., Japan

[21] Appl. No.: 112,070

[22] Filed: Aug. 26, 1993

[30] Foreign Application Priority Data

Aug. 31, 1992 [JP] Japan .................................. 4-231964

[51] Int. Cl.$^6$ .............................................. G01D 5/34
[52] U.S. Cl. ...................................... 324/96; 324/753; 324/244.1; 250/231.1
[58] Field of Search ...................... 324/96, 244.1, 753; 250/231.1; 359/315, 322, 325

[56] References Cited

U.S. PATENT DOCUMENTS 4,973,899 11/1990 Jones et al. .
5,153,427 10/1992 Takahashi ............................ 324/96

FOREIGN PATENT DOCUMENTS 2038004 9/1991 Canada .
0410234 1/1991 European Pat. Off. .
61-223821 4/1986 Japan .
62-223822 4/1986 Japan .

*Primary Examiner*—Kenneth A. Wieder
*Assistant Examiner*—Mark A. Wardas
*Attorney, Agent, or Firm*—Parkhurst, Wendel & Rossi

[57] ABSTRACT

An optical voltage electric field sensor of the type which includes a light source, a polarizer for linearly polarizing an incident light beam emanated from the light source, a phase plate for applying a phase difference to the linearly polarized light beam, a Pockels element for modulating the linearly polarized light beam applied with the phase difference in accordance with a voltage or electric filed applied thereto, an analyzer for separating the modulated light beam into a S-polarized light beam and a P-polarized light beam, a first light-receiving element arranged to receive the S-polarized light beam for converting the S-polarized light beam into a first electric signal $V_1$ indicative of the intensity of the light beam, and a second light-receiving element arranged to receive the P-polarized light beam for converting the P-polarized light beam into a second electric signal indicative of the intensity of the light beam. The sensor further includes a first calculation circuit for calculating an equation $$V_{11}=(V_1-DC_1)/DC_1$$

(where $DC_1$ is a direct current component of the first electric signal) to produce an output $V_{11}$ therefrom, a second calculation circuit for calculating an equation $$V_{22}=(V_2-DC_2)/DC_2$$

(where $DC_2$ is a direct current component of the second electric signal) to produce an output $V_{22}$ therefrom, and a third calculation circuit for calculating an equation $$V_3=1[(\alpha/V_{11})-(\beta/V_{22})]$$

(where $\alpha$ and $\beta$ are constants) to produce an output $V_3$ for measurement of the applied voltage or electric field.

4 Claims, 5 Drawing Sheets

OPTICAL VOLTAGE ELECTRIC FIELD SENSOR

BACKGROUND OF THE INVENTION

1. Field of the Invention

The present invention relates to an optical voltage.electric field sensor using the Pockels effect for measuring a voltage or electric field applied thereto.

2. Description of the Prior Art

In Japanese Patent Laid-open Publication Nos. 61-223821 and 61 223822, there have been proposed conventional optical voltage.electric field sensors of the type described above, which are designed to avoid influence dependent upon temperature characteristic property of double refraction of a phase plate in the form of a quarter-wavelength plate for enhancing the measurement accuracy thereof. As shown in FIG. 5, the optical voltage.electric field sensor 10 disclosed in the former reference includes a light source 11, a polarizer 12 arranged to receive an incident light beam from light source 11 through a rod lens 19a for dividing the incident light beam into first and second linearly polarized light beams the polarization planes of which are mutually crossed to one another, and a quarter-wavelength plate 13a, a Pockels element 14a, an analyzer 15a and an optical coupler 16 arranged in series on the light transmission path of one of the linearly polarized light beams. The optical voltage.electric field sensor 10 further includes a total reflection mirror 17a arranged to reflect the other polarized light beam, and a quarter-wavelength plate 13b, a Pockels element 14b and an analyzer 15b arranged in series on the light transmission path of the polarized light beam reflected by mirror 17a. The optical voltage.electric field sensor 10 further includes a total reflection mirror 17b arranged to reflect the light beam emanated from the analyzer 15b for transmitting the reflected light beam to the optical coupler 16, a light-receiving element 18a arranged to receive the modulated output light beam from the optical coupler 16 through a rod lens 19b, a pair of amplifiers 19c, 19d for amplifying electric signals applied thereto from the light-receiving element 18a through a distributor 18b, and a divider 18c for dividing the amplified electric signals.

In the optical voltage.electric field sensor 10, it is presumed that absolute values of temperature characteristic property of double refraction in the respective quarter-wavelength plates 13a, 13b are substantially equal to one another. Under such presumption, an optical sum of modulated light beams passed through the Pockels elements 14a, 14b is obtained by the optical coupler 16 to offset influences of the temperature characteristics of double refraction in the wavelength plates 13a and 13b.

However, the former optical voltage.electric field sensor involves the following three problems.

1) Although it is presumed that absolute values of temperature characteristic property of double refraction in the quarter-wavelength plates 13a, 13 b are substantially equal to one another, it is extremely rare that the absolute values of the temperature characteristic property of double refraction become equal to one another in actual practices of the sensor. It is, therefore, unable to completely offset influences of the temperature characteristic property of double refraction even though the modulated output light beam is produced by the optical sum at the optical coupler 16.

2) In the case that the intensities $I_1$, $I_2$ of the modulated light beams passed through the Pockels elements 14a, 14b are changed by 1/A, 1/B due to unexpected influences before being applied to the optical coupler 16, the light intensities $I_1$, $I_2$ of the modulated light beams and outputs $I_1 + I_2$ of the divider are calculated as follows:

$$I_1 = (E_{02}/2)[1 - k \cdot \Delta T - \pi \cdot (V/V\pi)] - $$
$$(E_{02}/2A)[1 - k \cdot \Delta T - \pi \cdot (V/V\pi)]$$

$$I_2 = (E_{02}/2)[1 + k \cdot \Delta T - \pi \cdot (V/V\pi)] - $$
$$(E_{02}/2B)[1 + k \cdot \Delta T - \pi \cdot (V/V\pi)]$$

$$I_1 + I_2 = (E_{02}/2)(1/A \cdot B)[(A + B) + $$
$$(A - B)(k \cdot \Delta T) - \pi \cdot (V/V\pi)(A + B)]$$
$$= [-\pi \cdot (V/V\pi)(A + B)]/[(A + B) + $$
$$(A - B)(k \cdot \Delta T)]$$

It is, therefore, difficult to eliminate errors in measurement of the light intensity caused by the difference between the temperature characteristics of double refraction in the quarter-wavelength plates 13a, 13b.

3) The component parts of the head portion of the sensor increases, and the construction of the sensor becomes complicated and large in size.

As shown in FIG. 6, the optical voltage.electric field sensor 20 disclosed in the latter reference includes a light source 21, a polarizer 22 arranged to receive an incident light beam from the light source 21 through a rod lens 29a for dividing the incident light beam into first and second linearly polarized light beams the polarization planes of which are mutually crossed to one another, and a Pockels element 23a, a quarter-wavelength plate 24a, an analyzer 25a and an optical coupler 26 arranged in series on the light transmission path of one of the linearly polarized light beams. The optical voltage.electric field sensor 20 further includes a total reflection mirror 27a arranged to reflect the other linearly polarized light beam, and a Pockels element 23b, a quarter-wavelength plate 24b, an analyzer 25b and a total reflection mirror 27b arranged in series on the light transmission path of the linearly polarized light beam reflected by mirror 27a. The total reflection mirror 27b is arranged to reflect the modulated incident light beam applied thereto through the quarter-wavelength plate 24b and analyzer 25b for transmitting the reflected light beam to the optical coupler 26. The optical voltage.electric field sensor 20 further includes a light-receiving element 28a arranged to receive the combined output light beams from the optical coupler 26 through a rod lens 29b, a pair of amplifiers 29c, 29d arranged to amplify electric signals applied thereto from the light-receiving element 28a through a distributor 28b, and a divider 28c for dividing the amplified electric signals.

In the optical voltage.electric sensor 20, the crystal axes of the Pockels elements 23a, 23b are arranged to be crossed at 90° about the light axis. With such arrangement of the Pockels elements 23a, 23b, the modulated light beams passed through the Pockels elements 23a, 23b are applied with a phase difference at the quarter-wavelength plates 24a, 24b so that the temperature characteristics of double refraction are reversed in their signs relatively to one another to produce a modulated output light beam wherein influences of the temperature characteristics of double refraction are offset.

However, the latter optical voltage.electric field sensor 20 involves the following problems:

1) Although the crystal axes of the Pockels elements 23a, 23b are arranged to be crossed at 90° about the light axis for offsetting the temperature characteristics of double refraction in the quarter-wavelength plates 23a, 23b, it is very difficult to precisely cross the crystal axes of the Pockels elements 23a, 23b at 90° about the light axis. As a result, a deviation of the angle causes an error in measurement of the intensity of the modulated light beams, and the influences of the temperature characteristics of double refraction in the quarter-wavelength plates 24a, 24b may not be offset even though the modulated output light beam is produced by the optical sum at the optical coupler 26.

2) In case the intensities $I_1$, $I_2$ of the modulated light beams are changed by $1/A$, $1/B$ due to unexpected influences before being applied to the optical coupler 26, there will occur errors in measurement of the intensity of the modulated light beams as in the former optical voltage.electric field sensor 10 described above. Moreover, the component parts of the head portion of the sensor increases, and the construction of the sensor becomes complicated and large in size.

SUMMARY OF THE INVENTION

It is, therefore, a primary object of the present invention to provide an optical voltage.electric field sensor with high accuracy capable of overcoming the problems or disadvantages discussed above.

According to the present invention, the primary object is accomplished by providing an optical voltage.electric field sensor for measuring on A.C. voltage or electric field applied thereto, including a light source, a polarizer arranged to linearly polarize an incident light beam emanated from the light source, a phase plate arranged to apply a phase difference to the linearly polarized light beam, a Pockels element coupled with the phase plate for modulating the linearly polarized light beam applied with the phase difference in accordance with the A.C. voltage or electric field applied thereto, an analyzer coupled with the Pockels element for separating the modulated light beam into an S-polarized light beam in a vibrative direction perpendicular to the polarization plane and a P-polarized light beam in a vibrative direction parallel with the polarization plane, a first light-receiving element arranged to receive the S-polarized light beam for converting the S-polarized light beam into a first electric signal $V_1$ indicative of the intensity of the S-polarized light beam, and a second light-receiving element arranged to receive the P-polarized light beam for converting the P-polarized light beam into a second electric signal $V_2$ indicative of the intensity of the P-polarized light beam, wherein the optical voltage.electric field sensor comprises a first calculation circuit for calculating an equation $$V_{11}=(V_1-DC_1)/DC_1$$

(where $DC_1$ is a direct current component of the first electric signal $V_1$) on a basis of the first electronic signal $V_1$ to produce an output $V_{11}$ therefrom, a second calculation circuit for calculating an equation $$V_{22}=(V_2-DC_2)/DC_2$$

(where $DC_2$ is a direct current component of the second electric signal $V_2$) on a basis of the second electric signal $V_2$ to produce an output $V_{22}$ therefrom, and a third calculation circuit for calculating an equation $$V_3=1/[(\alpha/V_{11})-(\beta/V_{22})]$$

(where $\alpha$, $\beta$ are constants) on a basis of both the outputs $V_{11}$ and $V_{22}$ to produce an output $V_3$ for measurement of the applied A.C. voltage or electric field.

In the optical voltage.electric field sensor, it is preferable that the polarizer, phase plate, Pockels element and analyzer are arranged in sequence on the light transmission path of the light beam. Alternatively the polarizer, Pockels element, phase plate and analyzer may be arranged in sequence on the light transmission path of the light beam. In this case, a reflection mirror is provided on the light transmission path to reflect the P-polarized light beam from the analyzer toward the second light-receiving element.

Assuming that in the optical voltage.electric field sensor the intensity of the incident light beam from the light source is "$I_0$" and that the intensities of the modulated light beams received the by the first and second light-receiving elements are "$I_1$" and "$I_2$" respectively, the following equations are satisfied.

$$I_1=(I_0/2)[1-\sin(\Gamma_z+k\cdot\Delta T)] \quad (1)$$

$$I_2=(I_0/2)[1+\sin(\Gamma_z+k\cdot\Delta T)] \quad (2)$$

In the equations (1) and (2), $\Gamma_z$ is represented by a formula $$\Gamma_z=(2\pi/\lambda)\cdot n_0^3\cdot\tau_{22}\cdot(L/d)\cdot V$$

wherein:
$n_0$: Ordinary ray refractive index of the Pockels element
$\tau_{22}$: Optical constant of the Pockels element
L: Length of the Pockels element in the direction of the light transmission path d: Thickness between the electrodes of the Pockels element
V: A.C. voltage applied to the Pockels element
k: Temperature change ratio of the phase difference applied by the phase plate
$\Delta T$: Temperature difference from 25° C.

In the case that the value of $(\Gamma_z+k\cdot\Delta T)$ is small, the following equations are satisfied.

$$I_1=(I_0/2)(1-\Gamma_z k\cdot\Delta T) \quad (3)$$

$$I_2=(I_0/2)(1+\Gamma_z+k\cdot\Delta T) \quad (4)$$

These light intensities $I_1$, $I_2$ are proportional to the electric signals $V_1$, $V_2$ converted by the first and second light-receiving elements. In the first and second calculation circuits, the following equations (5), (6) are calculated on a basis of the electric signals $V_1$, $V_2$ to produce outputs $V_{11}$, $V_{22}$ therefrom. In the third calculation circuit, the following equation (7) is calculated to produce and output $V_3$ therefrom.

$$V_{11}=(V_1-DC_1)/DC_1=(-\Gamma_z)/(1-k\cdot\Delta T) \quad (5)$$

$$V_{22}=(V_2-DC_2)/DC_2=(\Gamma_z)/(1-k\cdot\Delta T) \quad (6)$$

$$V_3=1/[(\alpha/V_{11})-(\beta/V_{22}] \quad (7)$$

where $V_1$, $V_2$ are proportional to $I_1$, $I_2$, and where $DC_1$ is represented by an equation $$DC_1 = (I_0/2)(1 - k \cdot \Delta T)$$

and $DC_2$ is represented by an equation $$DC_2 = (I_0/2)(1 + k \cdot \Delta T).$$

In the case that there is not any deviation in arrangement of the component parts of the sensor and any influence resulting in a change of the light intensities $I_1$, $I_2$, each value of $\alpha$, $\beta$ in the above equation (7) becomes a theoretical value of "1". Thus, the equation (7) can be replaced with the following equation (8) wherein the output $V_3$ becomes proportional to the applied voltage because of no presence of $k \cdot \Delta T$ dependent on the temperature characteristic property of double refraction.

$$\begin{aligned} V_3 &= 1/[(1/V_{11}) - (1/V_{22})] \\ &= 1/[(-1 + k \cdot \Delta T)/\Gamma_z - (1 + k \cdot \Delta T)/\Gamma_z] \\ &= -\Gamma_z/2 \end{aligned} \quad (8)$$

Since errors caused by a difference from the theoretical value are inherent in the sensor, the item $k \cdot \Delta T$ dependent on the temperature characteristic property of double refraction will be eliminated if each value of $\alpha$, $\beta$ is preliminary determined in an adjusted value. In an actual operating standard temperature range $T_L \cdot C$ to $T_U \cdot C$ of the sensor, the respective values of $\alpha$ and $\beta$ are inductively determined on a basis of the following equations (9) and (10).

$$[\alpha/V_{11}(\Delta T=0)] - [\beta/V_{22}(\Delta T=0)] = [\alpha/V_{11}(\Delta T=T_U-25)] - [\beta/V_{22}(\Delta T=T_U-25)] \quad (9)$$

$$[\alpha/V_{11}(\Delta T=0)] - [\beta/V_{22}(\Delta T=0)] = [\alpha/V_{11}(\Delta T=T_L-25)] - [\beta/V_{22}(\Delta T=T_L-25)] \quad (10)$$

In case the light intensities $I_1$, $I_2$ each are changed by $1/A$, $1/B$, the above equations (3), (4) are replaced with the following equations (11), (12), and the above equations (5), (6) are replaced with the following equations (13), (14). Thus, the output $V_3$ can be obtained without any influence of A and B.

$$I_1 = (I_0/2A)(1 - \Gamma_z - k \cdot \Delta T) \quad (11)$$

$$I_2 = (I_0/2B)(1 + \Gamma_z + k \cdot \Delta T) \quad (12)$$

$$V_{11} = (V_1 - DC_1)/DC_1 = (-\Gamma_z)/(1 - k \cdot \Delta T) \quad (13)$$

$$V_{22} = (V_2 - DC_2)/DC_2 = (\Gamma_z)/(1 + k \cdot \Delta T) \quad (14)$$

$$V_3 = 1/[(1/V_{11}) - (1/V_{22})] = -\Gamma_z/2$$

When compared with the conventional optical voltage.electric field sensors shown in FIGS. 5 and 6, the head portion of the sensor according to the present invention can be constructed by a small number of component parts and small in size.

BRIEF DESCRIPTION OF THE DRAWINGS

Other objects, features and advantages of the present invention will be more readily appreciated from the following detailed description of a preferred embodiment thereof when taken together with the accompanying drawings, in which.

DESCRIPTION OF THE PREFERRED EMBODIMENT

Figure 1:
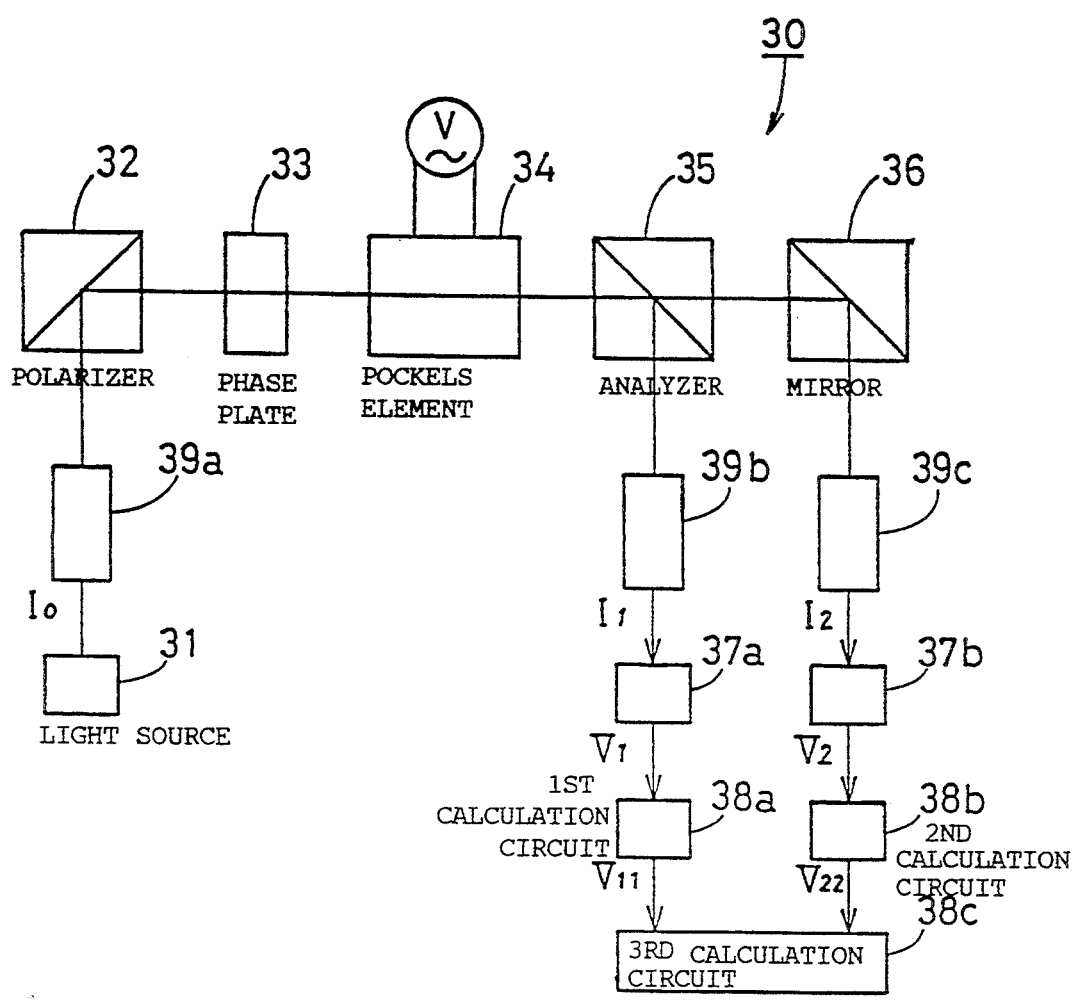
FIG. 1 is a schematic illustration of an optical voltage.electric field sensor in accordance with the present invention.

In FIG. 1 of the drawings, there is schematically illustrated a preferred embodiment of an optical voltage.electric field sensor 30 according to the present invention. The optical voltage.electric field sensor 30 includes a light source 31 in the form of a light-emitting diode (LED), a polarizer 32, a quarter-wavelength plate 33, a Pockels element 34, and analyzer 35, a total reflection mirror 36, first and second light-receiving elements 37a, 37b, and first, second and third calculation circuits 38a, 38b and 38c. The optical voltage.electric field sensor 30 further includes a rod lens 39a arranged between the light source 31 and polarizer 32 and a pair of rod lenses 39b, 39c which are arranged respectively between the analyzer 35 and light-receiving element 37a and between the total reflection mirror 36 and light-receiving element 37b. In the optical voltage.electric field sensor 30, a light beam $I_0$ emanated from the light source 31 is transmitted through and optical fiber to the rod lens 39a and received by polarizer 32 as parallel light beams from the rod lens 39a. The polarizer 32 converts the incident parallel light beams into a linearly polarized light beam, and the Pockels element 34 receives the linearly polarized light beam from polarizer 32 through the quarter-wavelength plate 33 to modulate the linearly polarized light beam in accordance with an A.C. voltage or electric field applied thereto. The quarter-wavelength plate 33, Pockels element 34, analyzer 35 and reflection mirror 36 are arranged in series on the light transmission path of the linearly polarized light beam.

The quarter-wavelength plate 33 is made of rock crystal and is arranged in such a manner that the principal axis direction of indicatrix is located at 45° relative to the polarization plane of the linearly polarized light beam to apply a phase difference of $\pi/2$ to the linearly polarized light beam. The Pockels element 34 is made of a single crystal of $LiNbO_3$ and is arranged in such a manner that a z-axis of the crystal is placed in parallel with the light axis and that the principal axis direction of indicatrix of the quarter-wavelength plate 33 coincides with optical axes $x'$ and $y'$ defined by the following formula.

$$x' = [1/(2)^{\frac{1}{2}}](x - y)$$

$$y' = [1/(2)^{\frac{1}{2}}](x + y)$$

The Pockels element 34 is provided with electrodes to be applied with an A.C. voltage.

The analyzer 35 separates the modulated incident light beam into an S-polarized light beam in a vibrative direction perpendicular to the plane of the light beam and a P-polarized light beam in a vibrative direction parallel with the plane of the incident light beam. The S-polarized light beam is emanated in a direction perpendicular to the incident light beam, while the P-polarized light beam is emanated in the same direction as the incident light beam. The S-polarized light beam transmitted from analyzer 35 is condensed by the rod lens 39b and received by the first light receiving element 37a, while the P-polarized light beam reflected by mirror 36 is condensed by the rod lens 39c and received by the second light-receiving element 37b. The first light-receiving element 37a converts the S-polarized light beam into a first electric signal $V_1$ indicative of the light intensity $I_1$ to be calculated by the first calculation circuit 38a, while the second light-receiving element 37b converts the P-polarized light beam into a second electric signal $V_2$ indicative of the light intensity $I_2$ to be calculated by the second calculation circuit 38b.

The first calculation circuit 38a calculates an equation $$V_{11} = (V_1 - DC_1)DC_1$$

based on the first electric signal $V_1$ to produce an output signal $V_{11}$ therefrom, while the second calculation circuit 38b calculates an equation $$V_{22} = (V_2 - DC_2)/DC_2$$

to produce an output signal $V_{22}$ therefrom. In the equations, $DC_1$ is a direct current component of the first electric signal $V_1$, and $DC_2$ is a direct current component of the second electric signal $V_2$. The third calculation circuit 38c calculates an equation $$V_3 = 1/[(\alpha/V_{11}) - (\beta/V_{22})]$$

based on the output signals $V_{11}$, $V_{22}$ to produce an output signal $V_3$ therefrom. Assuming that the intensity of the incident light beam form the light source 31 is $I_0$ and that each value of $\alpha$, $\beta$ is "1", the respective intensities $I_1$, $I_2$ of the output light beams received by the first and second light-receiving elements 38a, 38b are represented by the following equations (3), (4), and the output signals $V_{11}$, $V_{22}$ are represented by the following equations (5), (6).

$$I_1 = (I_0/2)(1 - \Gamma_z - k \cdot \Delta T) \qquad (3)$$

$$I_2 = (I_0/2)(1 + \Gamma_z + k \cdot \Delta T) \qquad (4)$$

$$V_{11} = (V_1 - DC_1)/DC_1 = (-\Gamma_z)/(1 - k \cdot \Delta T) \qquad (5)$$

$$V_{22} = (V_2 - DC_2)/DC_2 = (\Gamma_z)/(1 + k \cdot \Delta T) \qquad (6)$$

Thus, the output signal $V_3$ of the third calculation circuit 38c is represented by the following equations (7) and (8).

$$\begin{aligned} V_3 &= 1/[(\alpha/V_{11}) - (\beta/V_{22})] & (7) \\ V_3 &= 1/[(1/V_{11}) - (1/V_{22})] & (8) \\ &= 1/[(-1 + k \cdot \Delta T)/\Gamma_z - (1 + k \cdot \Delta T)/\Gamma_z] \\ &= -\Gamma_z/2 \end{aligned}$$

Accordingly, the output $V_3$ expressed by the equation (8) is not dependent on the temperature characteristic property of double refraction in the quarter-wavelength plate 33.

Assuming that the respective values of $\alpha$, $\beta$ are not "1", they are preliminary determined on a basis of the following equations (9) and (10).

$$[\alpha/V_{11}(\Delta T=0)] - [\beta/V_{22}(\Delta T=0)] = [\alpha/V_{11}(\Delta T=T_U-25)] - [\beta/V_{22}(\Delta T=T_U-25)] \qquad (9)$$

$$[\alpha/V_{11}(\Delta T=0)] - [\beta/V_{22}(\Delta T=0)] = [\alpha/V_{11}(\Delta T=T_L-25)] - [\beta/V_{22}(\Delta T=T_L-25)] \qquad (10)$$

In case the respective intensities $I_1$, $I_2$ of the output light beams are changed respectively 1/A, 1/B due to unexpected influence such as external disturbance, they are represented by the following equations (11), (12).

$$I_1 = (I_0/2A)(1 - \Gamma_z - k \cdot \Delta T) \qquad (11)$$

$$I_2 = (I_0/2B)(1 + \Gamma_z + k \cdot \Delta T) \qquad (12)$$

Thus, the output signals $V_{11}$, $V_{22}$ of the first and second calculation circuits 38a, 38b are represented by the following equations (13), (14).

$$V_{11} = (V_1 - DC_1)/DC_1 = (-\Gamma_z)/(1 - k \cdot \Delta T) \qquad (13)$$

$$V_{22} = (V_2 - DC_2 = (\Gamma_z)/(1 + k \cdot \Delta T) \qquad (14)$$

As a result, the output signal $V_3$ is represented by $$1/[(1/V_{11}) - (1/V_{22})] = -\Gamma_z/2$$

Accordingly, the output $V_3$ of the third calculation circuit 38c is not dependent on the temperature characteristic property of double refraction in the quarter-wavelength plate 33.

Figure 2:
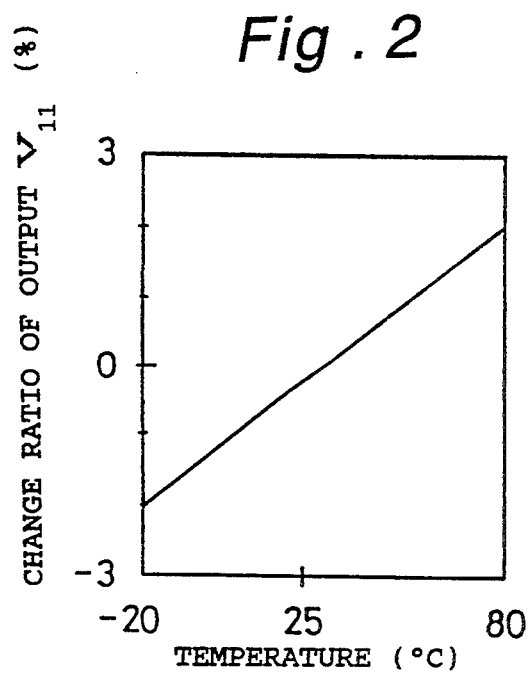
FIG. 2 is a graph showing a temperature characteristic of an output $V_{11}$ of the sensor.
Figure 3:
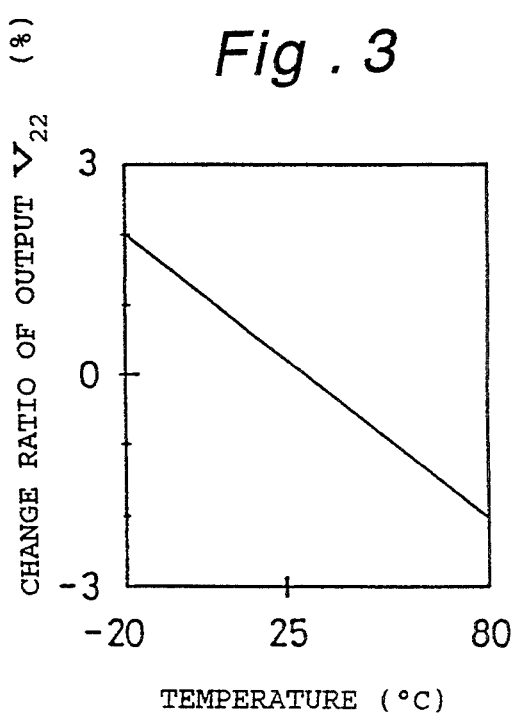
FIG. 3 is a graph showing a temperature characteristic of an output $V_{22}$ of the sensor.
Figure 4:
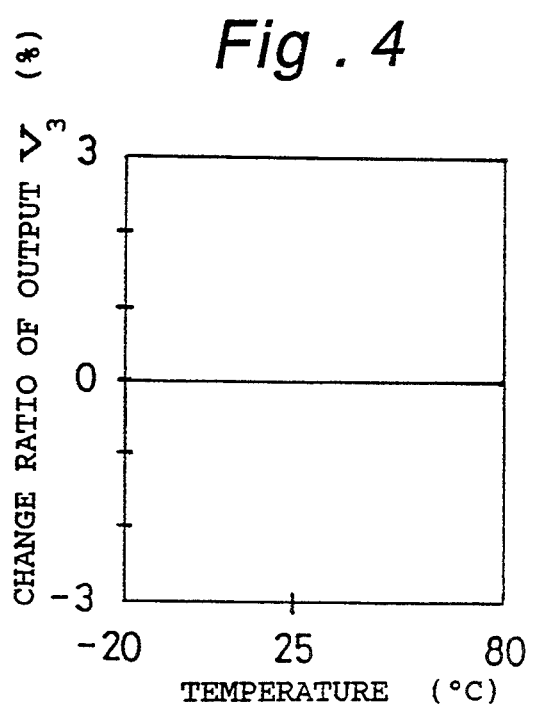
FIG. 4 is a graph showing a temperature characteristic of an output $V_3$ of the sensor.

In FIGS. 2, 3 and 4, there are illustrated respective change ratios of the outputs $V_{11}$, $V_{22}$, $V_3$ in relation to the temperature of the sensor. In a maximum operating standard temperature range ($-20°$ C. to $80°$ C.) of the sensor, the outputs $V_{11}$ and $V_{22}$ represent opposite temperature characteristics, and the output $V_3$ is not influenced by a change of the temperature.

Experiment

Figure 5:
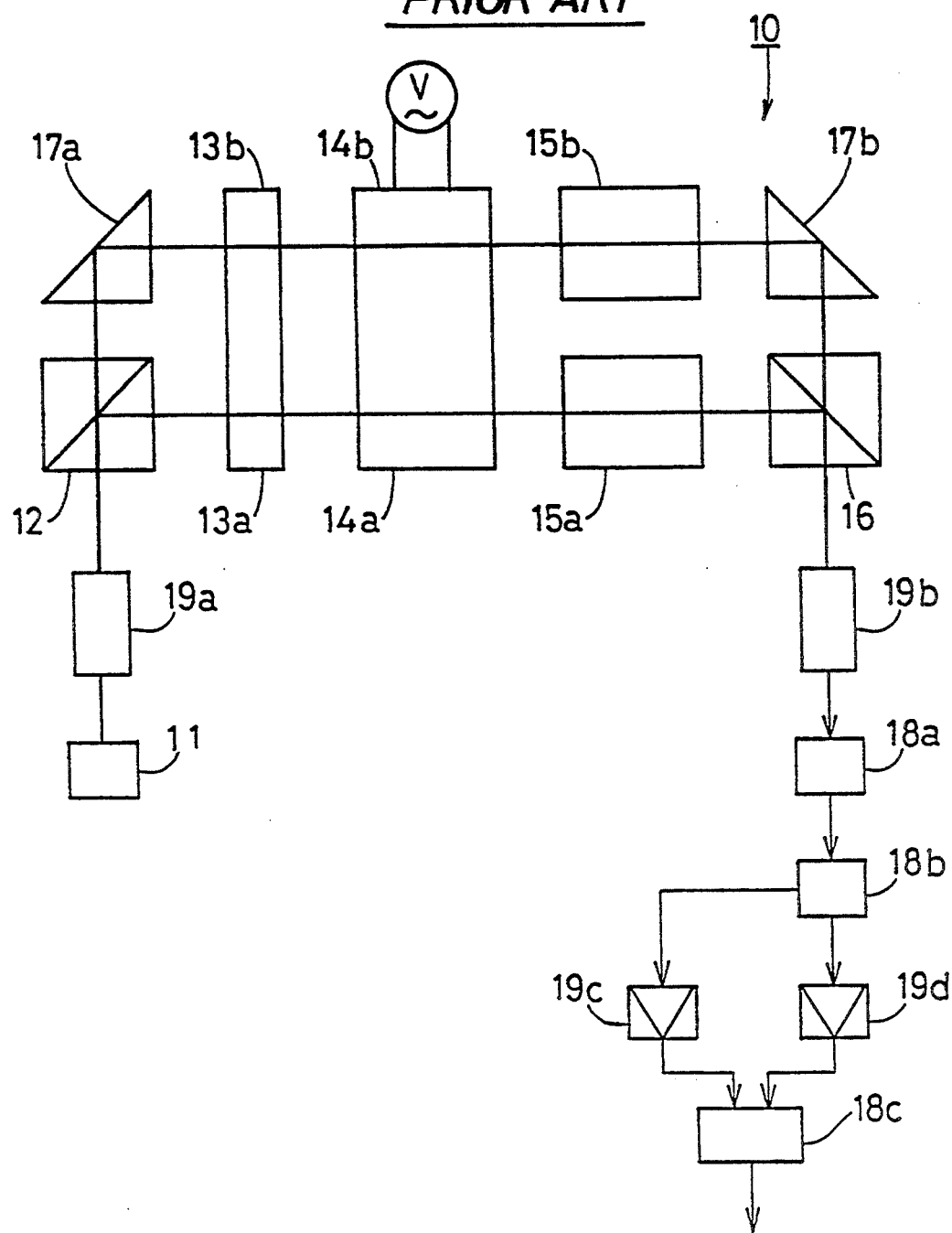
FIG. 5 is a schematic illustration of a conventional optical voltage.electric field sensor.
Figure 6:
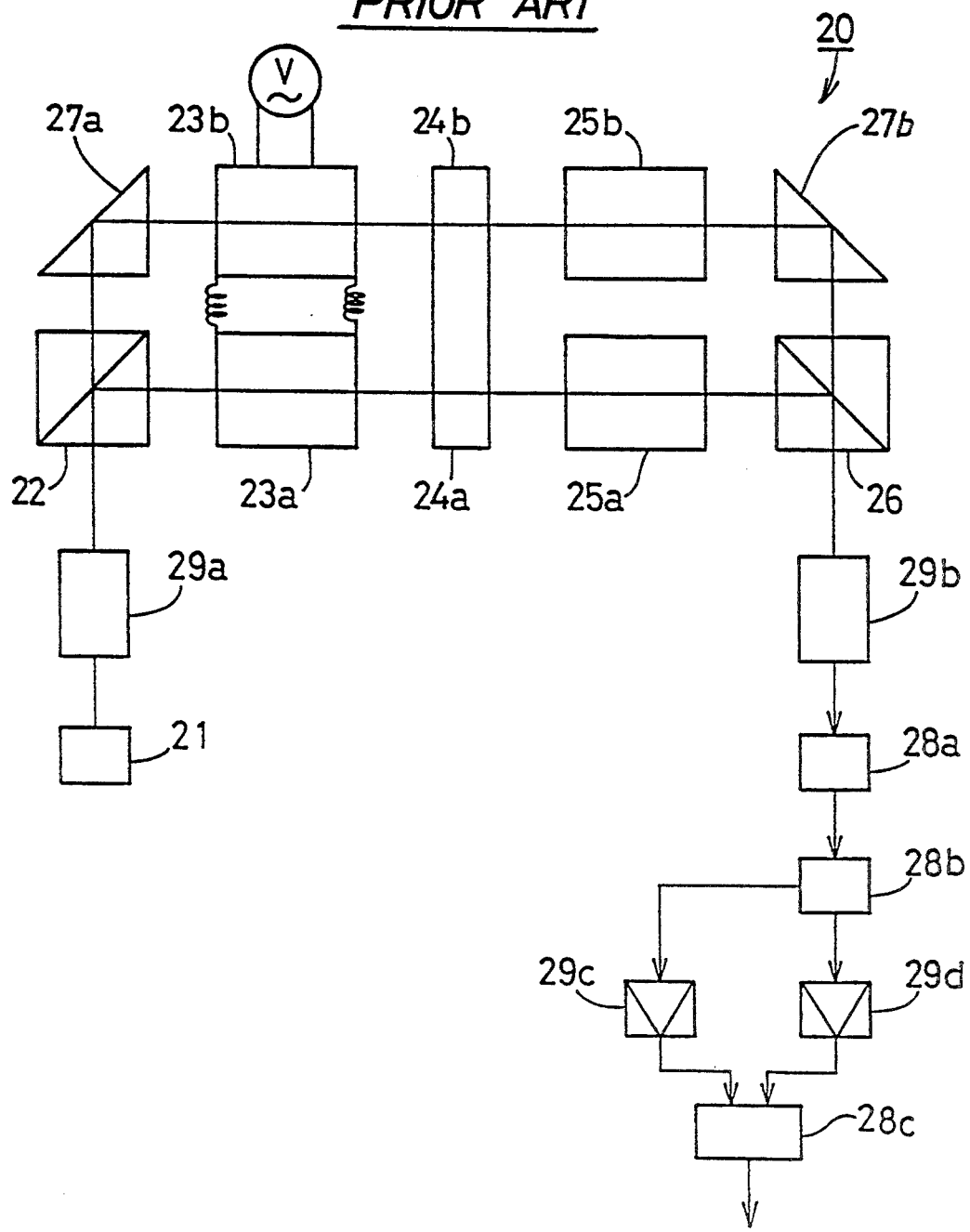
FIG. 6 is a schematic illustration of another conventional optical voltage.electric field sensor.

A number of the optical voltage.electric field sensors according to the present invention and conventional sensors shown in FIGS. 5 and 6 have been manufactured to observe fluctuation of the output $V_3$ in the case that the temperature of the sensors was changed in the maximum operating standard temperature range ($-20°$ C. to $80°$ C.) and that a transmission amount of the light beams among the optical parts was changed. The result of the observation was obtained as described below.

1) In the three kinds of sensors, the output $V_3$ was proportional to the voltage applied thereto.

2) In regard to fluctuation of the output caused by the temperature change, the outputs of the conventional sensors of about 80% were fluctuated, while any fluctuation of the output was not found in the sensors according to the present invention.

3) In regard to fluctuation of the output caused by change of the transmission amount of the light beam, fluctuation of the outputs was found in the conventional sensors of about 50%, while any fluctuation of the output was not found in the sensors according to the present invention.

Although in the above preferred embodiment, the present invention has been adapted to the optical voltage.electric field sensor wherein the polarizer 32, phase late 33, Pockels element 34 and analyzer 35 are arranged in sequence on the light transmission path of the light beam, it is obvious to one of ordinary skill in the art that the present invention may be adapted to an optical voltage.electric field sensor wherein the polarizer 32, Pockels element 34, phase plate 33 and analyzer 35 are arranged in sequence on the light transmission path of the light beam.

What is claimed is:

1. An optical voltage.electric field sensor for measuring an A.C. voltage or electric field applied thereto, comprising:
    a light source;
    a polarizer arranged to linearly polarize an incident light beam emanated from the light source;
    a phase plate arranged to apply a phase difference to the linearly polarized light beam;
    a Pockels element coupled with the phase plate for modulating the linearly polarized light beam applied with the phase difference in accordance with A.C. voltage or electric field applied thereto;
    an analyzer coupled with the Pockels element for separating the modulated light beam into an S-polarized light beam in a vibrative direction perpendicular to the polarization plane and a P-polarized light beam in a vibrative direction parallel with the polarization plane;
    a first light-receiving element arranged to receive the S-polarized light beam for converting the S-polarized light beam into a first electric signal $V_1$ indicative of the intensity of the S-polarized light beam;
    a second light-receiving element arranged to receive the P-polarized light beam for converting the P-polarized light beam into a second electric signal $V_2$ indicative of the intensity of the P-polarized light beam;
    a first calculation circuit for calculating an equation $$V_{11}=(V_1-DC_1)/DC_1, DC_1$$

being a direct current component of the first electric signal, on a basis of the first electric signal $V_1$ to produce an output $V_{11}$ therefrom;
    a second calculation circuit for calculating an equation $$V_{22}=(V_2-DC_2)/DC_2, DC_2$$

being a direct current component of the second electric signal, on a basis of the second electric signal $V_2$ to produce an output $V_{22}$ therefrom; and
    a third calculation circuit for calculating an equation $$V_3=1/\{(\alpha/V_{11})-(\beta/V_{22})\},$$

$\alpha$ and $\beta$ being constants, on a basis of both the outputs $V_{11}$ and $V_{22}$ to produce an output $V_3$ for measurement of the applied A.C. voltage or electric field.

2. An optical voltage.electric field sensor as claimed in claim 1, wherein the polarizer, phase plate, Pockels element and analyzer are arranged in sequence on the light transmission path of the light beam.

3. An optical voltage.electric field sensor as claimed in claim 1, wherein the polarizer, Pockels element, phase plate and analyzer are arranged in sequence on the light transmission path of the light beam.

4. An optical voltage.electric field sensor as claimed in claim 1, wherein a reflection mirror is arranged on the light transmission path of the light beam to reflect the P-polarized light beam toward the second light-receiving element.

* * * * *